United States Patent
Frazier

(10) Patent No.: US 10,424,679 B2
(45) Date of Patent: Sep. 24, 2019

(54) PROGRAMMABLE FREQUENCY SELECTIVE SURFACES

(71) Applicant: RAYTHEON COMPANY, Waltham, MA (US)

(72) Inventor: Gary A. Frazier, Garland, TX (US)

(73) Assignee: Raytheon Company, Waltham, MA (US)

( * ) Notice: Subject to any disclaimer, the term of this patent is extended or adjusted under 35 U.S.C. 154(b) by 386 days.

(21) Appl. No.: 15/289,900

(22) Filed: Oct. 10, 2016

(65) Prior Publication Data
US 2018/0102592 A1 Apr. 12, 2018

(51) Int. Cl.
| | | |
|---|---|---|
| *H01Q 3/44* | (2006.01) | |
| *H01L 23/498* | (2006.01) | |
| *H01L 25/065* | (2006.01) | |
| *H01L 23/66* | (2006.01) | |
| *H01L 23/50* | (2006.01) | |
| *H01L 25/16* | (2006.01) | |
| *H01L 31/02* | (2006.01) | |
| *H01L 31/042* | (2014.01) | |
| *G11C 19/00* | (2006.01) | |
| *H02J 3/38* | (2006.01) | |
| *H01Q 1/42* | (2006.01) | |
| *H01Q 15/00* | (2006.01) | |
| *H01L 31/153* | (2006.01) | |

(52) U.S. Cl.
CPC ...... *H01L 31/042* (2013.01); *H01L 23/49838* (2013.01); *H01L 23/50* (2013.01); *H01L 31/153* (2013.01); *H01Q 15/002* (2013.01); *H01L 25/167* (2013.01); *H01L 2223/6694* (2013.01)

(58) Field of Classification Search
CPC . H01L 31/042; H01L 23/49838; H01L 23/50; H01L 23/66; H01L 25/0655; H01L 25/167; H01L 31/153; H01Q 15/002
USPC .......................................... 307/115; 174/350
See application file for complete search history.

(56) References Cited

U.S. PATENT DOCUMENTS

| | | | |
|---|---|---|---|
| 5,619,365 A | 4/1997 | Rhoads et al. | |
| 5,619,366 A * | 4/1997 | Rhoads .................. | B82Y 20/00 359/248 |
| 5,627,672 A | 5/1997 | Rhoads et al. | |
| 5,661,594 A | 8/1997 | Rhoads et al. | |
| 6,028,692 A | 2/2000 | Rhoads et al. | |
| 7,136,029 B2 * | 11/2006 | Ramprasad ............. | H01Q 1/22 343/909 |
| 9,780,434 B1 * | 10/2017 | Weller ................... | H01Q 1/085 |
| 2014/0209374 A1 * | 7/2014 | Song ..................... | H01L 23/552 174/388 |
| 2018/0053994 A1 * | 2/2018 | Grando ................. | H01Q 1/425 |

* cited by examiner

*Primary Examiner* — Timothy J Thompson
*Assistant Examiner* — Charles Pizzuto
(74) *Attorney, Agent, or Firm* — Lewis Roca Rothgerber Christie LLP

(57) ABSTRACT

A controllable frequency selective surface. The frequency selective surface has a plurality of conductive patches with integrated circuits straddling gaps between, and connected to, pairs of patches separated by gaps. Each integrated circuit presents a controllable impedance and as a result the characteristics of the frequency selective surface are controllable.

20 Claims, 10 Drawing Sheets

PROGRAMMABLE FREQUENCY SELECTIVE SURFACES

BACKGROUND

1. Field

One or more aspects of embodiments according to the present invention relate to frequency selective surfaces, and more particularly to frequency selective surfaces with programmable characteristics.

2. Description of Related Art

In some commercial or military applications, it may be desirable for a surface, such as a radome, through which electromagnetic waves may be transmitted or from which they may reflect, to have frequency dependent transmission and reflection characteristics. Moreover, it may be advantageous for these characteristics to change with time, as circumstances change. For example, it may at some times be advantageous to shield the contents of a radome from electromagnetic radiation incident from outside the radome, and it may at other times be advantages to allow electromagnetic radiation generated within the radome to be transmitted out of the radome.

Thus, there is a need for a surface having controllable transmission and reflection characteristics.

SUMMARY

Aspects of embodiments of the present disclosure are directed toward a frequency selective surface having a plurality of conductive patches with integrated circuits straddling gaps between, and connected to, pairs of patches separated by gaps. Each integrated circuit presents a controllable impedance and as a result the characteristics of the frequency selective surface are controllable.

According to an embodiment of the present invention there is provided a controllable frequency-selective surface, including: a dielectric substrate; a plurality of conductive patches on a first surface of the dielectric substrate; and a plurality of integrated circuits, each straddling a gap between a first patch of the plurality of conductive patches and a second patch of the plurality of conductive patches, connected at a first contact to the first patch and at a second contact to the second patch, and being configured to receive a digital control word and to change, in response, an impedance between the first contact and the second contact, to cause the electromagnetic transmission or reflection characteristics of the frequency selective surface to change.

In one embodiment, each of the plurality of integrated circuits is configured to receive the digital control word through a conductive electrical data connection.

In one embodiment, the controllable frequency-selective surface includes: a dielectric layer on the plurality of conductive patches; and a conductive trace on the dielectric layer, wherein the data connection includes the conductive trace.

In one embodiment, an integrated circuit of the plurality of integrated circuits straddles a first gap and includes an array of switches configured to operate in a first state and in a second state, wherein the conductance across the first gap through the integrated circuit in the first state is different from the conductance across the first gap through the integrated circuit in the second state.

In one embodiment, an integrated circuit of the plurality of integrated circuits straddles a first gap and includes an array of switches configured to operate in a first state and in a second state, wherein the real part of the conductance across the first gap through the integrated circuit in the first state is different from the real part of the conductance across the first gap through the integrated circuit in the second state.

In one embodiment, an integrated circuit of the plurality of integrated circuits straddles a first gap and includes an array of switches configured to operate in a first state and in a second state, wherein the imaginary part of the conductance across the first gap through the integrated circuit in the first state is different from the imaginary part of the conductance across the first gap through the integrated circuit in the second state.

In one embodiment, the integrated circuits of the plurality of integrated circuits are configured to receive a control word simultaneously.

In one embodiment, an integrated circuit of the plurality of integrated circuits includes an array of switches, the conductance across the gap through the integrated circuit is determined by respective states of the switches of the array of switches, and the integrated circuit is configured to set the states of the switches of the array of switches based on a received code word.

In one embodiment, the controllable frequency-selective surface includes a plurality of switch control lines; and an array of switches, each of the array of switches being connected to a respective switch control line of the plurality of switch control lines.

In one embodiment, each switch is a transistor.

In one embodiment, each of the plurality of integrated circuits is configured to receive the digital control word through an optical data connection.

In one embodiment, an integrated circuit of the plurality of integrated circuits straddles a first gap and includes an array of switches configured to operate in a first state and in a second state, wherein the conductance across the first gap through the integrated circuit in the first state is different from the conductance across the first gap through the integrated circuit in the second state.

In one embodiment, an integrated circuit of the plurality of integrated circuits straddles a first gap and includes an array of switches configured to operate in a first state and in a second state, wherein the real part of the conductance across the first gap through the integrated circuit in the first state is different from the real part of the conductance across the first gap through the integrated circuit in the second state.

In one embodiment, an integrated circuit of the plurality of integrated circuits straddles a first gap and includes an array of switches configured to operate in a first state and in a second state, wherein the imaginary part of the conductance across the first gap through the integrated circuit in the first state is different from the imaginary part of the conductance across the first gap through the integrated circuit in the second state.

In one embodiment, the integrated circuits of the plurality of integrated circuits are configured to receive a control word simultaneously.

In one embodiment, an integrated circuit of the plurality of integrated circuits includes an array of switches, the conductance across the gap through the integrated circuit is determined by respective states of the switches of the array of switches, and the integrated circuit is configured to set the states of the switches of the array of switches based on a received code word.

In one embodiment, the controllable frequency-selective surface includes a plurality of switch control lines: and an array of switches, each of the array of switches being connected to a respective switch control line of the plurality of switch control lines.

In one embodiment, each switch is a transistor.

In one embodiment, the integrated circuit is configured to receive operating power in the form of illumination by light.

In one embodiment, the optical data connection includes a first solar cell, and wherein the integrated circuit is configured to receive: operating power through a second solar cell; and a clock signal through a third solar cell, the first solar cell being sensitive to light at a first wavelength, insensitive to light at a second wavelength, and insensitive to light at a third wavelength; the first wavelength being different from the second wavelength and from the third wavelength, and the second wavelength being different from the third wavelength, the second solar cell being sensitive to light at the second wavelength, insensitive to light at the first wavelength, and insensitive to light at the third wavelength; the third solar cell being sensitive to light at the third wavelength, insensitive to light at the first wavelength, and insensitive to light at the second wavelength; the integrated circuit being insensitive, except for the first solar cell, the second solar cell, and the third solar cell, to light at each of the first wavelength, the second wavelength, and the third wavelength.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a programmable frequency selective surface provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
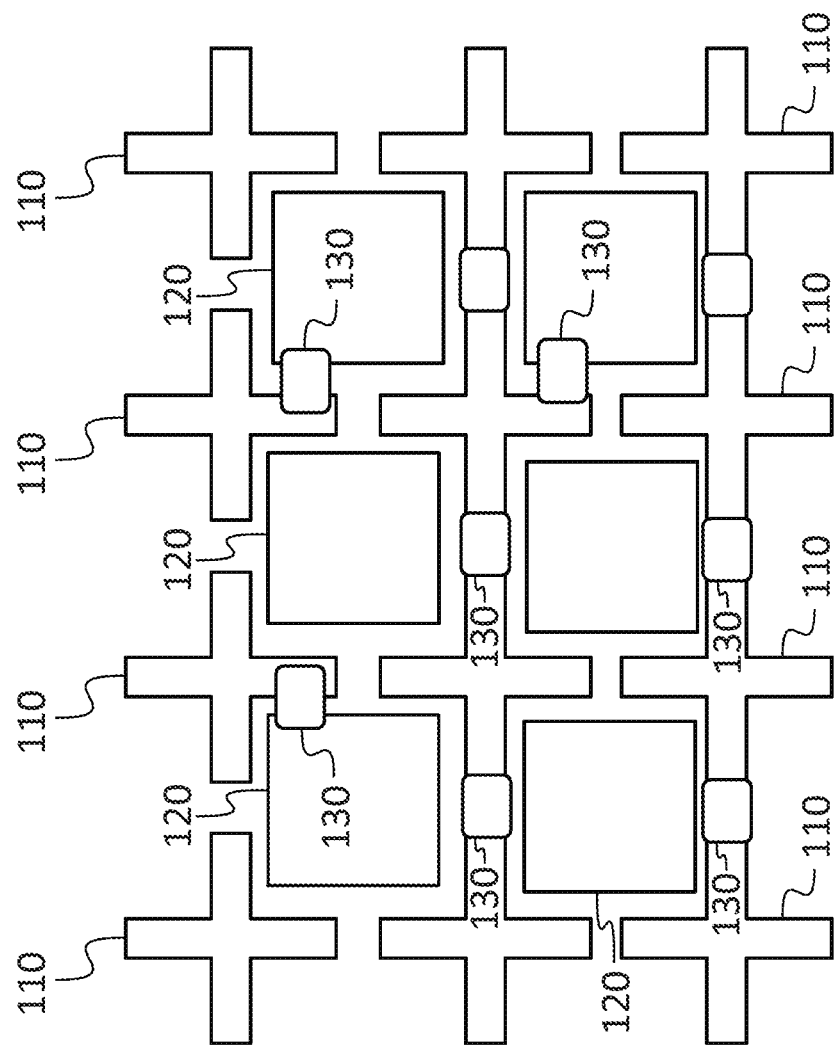
FIG. 1A is a plan view of a frequency selective surface, according to an embodiment of the present invention.

Referring to FIG. 1A, in one embodiment a frequency selective surface includes a patterned surface that has transmission and reflection properties affected by on the pattern of conductive patches on the surface. For example the surface may include a pattern of first conductive patches 110 (each in the shape of a "+") and a pattern of second conductive patches 120 (each in the shape of a square) that may alter the transmission and the reflection properties so that instead of continuous or wavelength independent transmission or reflection (as, for example a uniform conductive sheet may provide) the frequency selective surface may have a wavelength or frequency specific transmission or reflection. The elongated crossed conductive patches that form each of the first conductive patches may, for example, have a resonant response for electromagnetic waves with a wavelength that is twice the length of each elongated conductor.

The frequency selective surface may also include controllable impedance elements 130, each connected, for example, between two adjacent conductive patches of the first conductive patches 110 or between a first conductive patch and a second conductive patch. Changing the impedance of the controllable impedance elements may affect the characteristics of the frequency selective surface, e.g., shifting a resonant frequency of the frequency selective surface. These controllable impedance elements (described in further detail below) may include switching elements (e.g., transistors) and reactive elements, so that each controllable impedance element may present a lumped impedance that may be controlled, to control the properties of the frequency selective surface.

A radome may be constructed of a frequency selective surface, for example, so that at a first point in time electromagnetic radiation in a first frequency range may pass freely through the radome and electromagnetic waves of a second frequency may be blocked, e.g., reflected or absorbed. Moreover, it may be useful in some circumstances to change the frequency-dependent properties of the radome, so that at a second point in time electromagnetic waves in a third frequency range may pass freely through the radome and electromagnetic waves of a fourth frequency may be blocked.

In the exemplary frequency selective surface of FIG. 1A, separate conductive areas are distributed across the frequency selective surface, separated by regions that are not conductive. In another embodiment, illustrated in FIG. 1B, the frequency selective surface instead includes a conductive patch that forms a conductive region 140 extending across the entire frequency selective surface except for circular holes, each containing a circular conductive patch 150 (each conductive patch 150 being separated from the conductive region 140 by an annular non-conducting region). The frequency selective surface of FIG. 1B includes a controllable impedance element bridging, or "straddling", each annular region to form a controllable impedance between each circular conductive patch 150 and the conductive region 140.

Figure 2A:
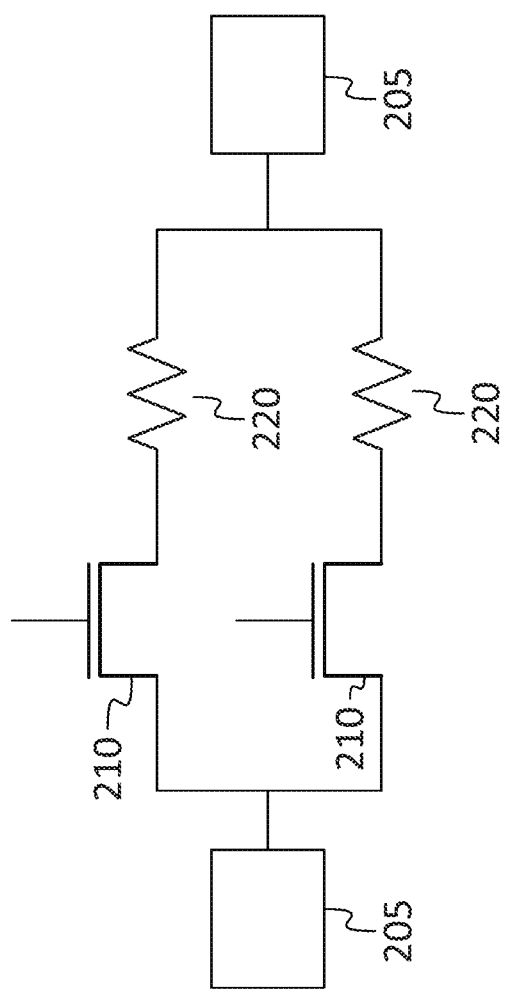
FIG. 2A is a schematic diagram of an output circuit of an integrated circuit, according to an embodiment of the present invention.
Figure 2B:
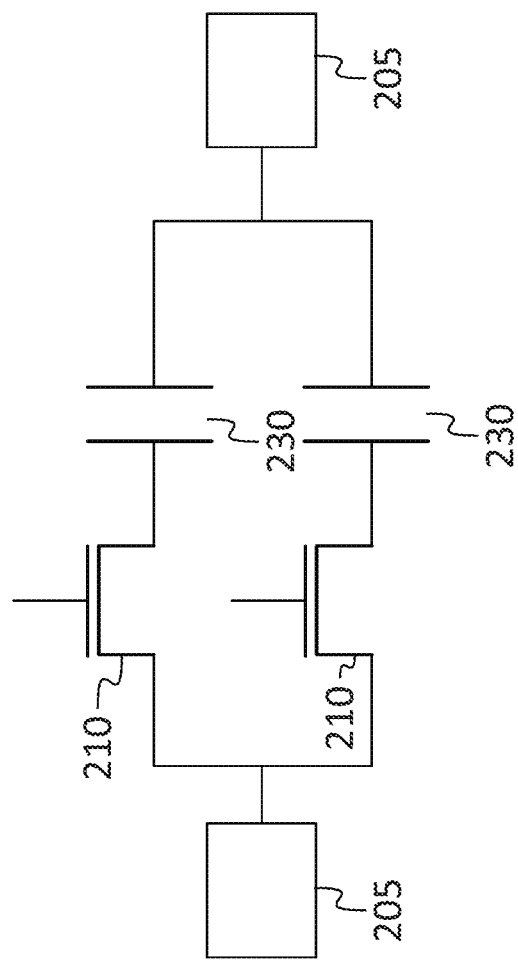
FIG. 2B is a schematic diagram of an output circuit of an integrated circuit, according to another embodiment of the present invention.
Figure 2C:
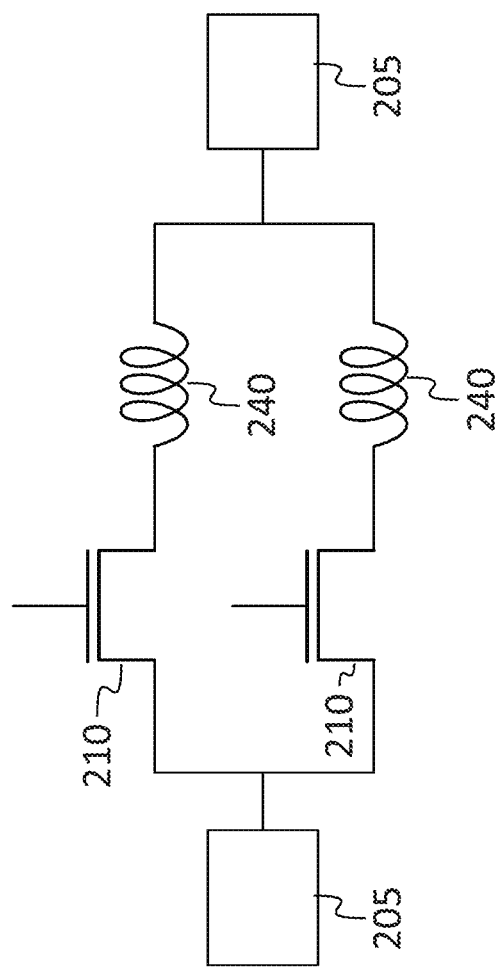
FIG. 2C is a schematic diagram of an output circuit of an integrated circuit, according to another embodiment of the present invention.

In some embodiments, the controllable impedance element is, or includes, an integrated circuit. The integrated circuit may have an output with two contacts 205 (FIGS. 2A-2C), one of which is connected to one conductive patch (e.g., one of the first conductive patches 110) and another of which is connected to another conductive patch (e.g., one of the second conductive patches 120). The integrated circuit may have an output circuit including an array of transistors connected, e.g., in parallel across the two contacts of the output. When all of the transistors are turned off, the controllable impedance element may act as a high impedance connected across the two conductive patches. When one or more transistors are turned on, the controllable impedance element may acts as a lower impedance connected across the two conductive patches, the impedance depending for example on the number and respective sizes of the transistors that are turned on. In particular, the total admittance the controllable impedance element provides across the two contacts at the output of the controllable impedance element may be the total of the admittances of the transistors that are turned on. In some embodiments, as illustrated in FIGS. 2A, 2B, and 2C. each transistor 210 may have a circuit element (e.g., a resistor 220, a capacitor 230, or an inductor 240) connected in series with it, so that when it is turned on, its contribution to the total admittance is the reciprocal of the sum of (i) the on-impedance of the transistor and (ii) the impedance of the element connected in series with the transistor. Reactive elements such as inductors or capacitors may be fabricated in an integrated circuit using ferromagnetic or ferroelectric materials, respectively, to reduce the chip area required for each such element.

In one embodiment a field effect transistor with a channel width of 10 microns may have an on resistance of 50 ohms, and a parallel combination of resistors with a total channel width of 500 microns may have an on resistance of 1 ohm. Accordingly, in some embodiments, an array of transistors connected in parallel may provide a range of impedances between a high impedance (when all transistors are turned off) and a low value, of e.g., 1 ohm, when all of the transistors are turned on. The impedance may be, e.g., 50 ohms when one transistor is turned on. In some embodiments that transistors are all identical (within fabrication tolerances); in other embodiments the array of transistors has binary weighted channel widths or gate widths (i.e., each transistor has a gate width that is half or double that of another transistor in the array).

Figure 3:
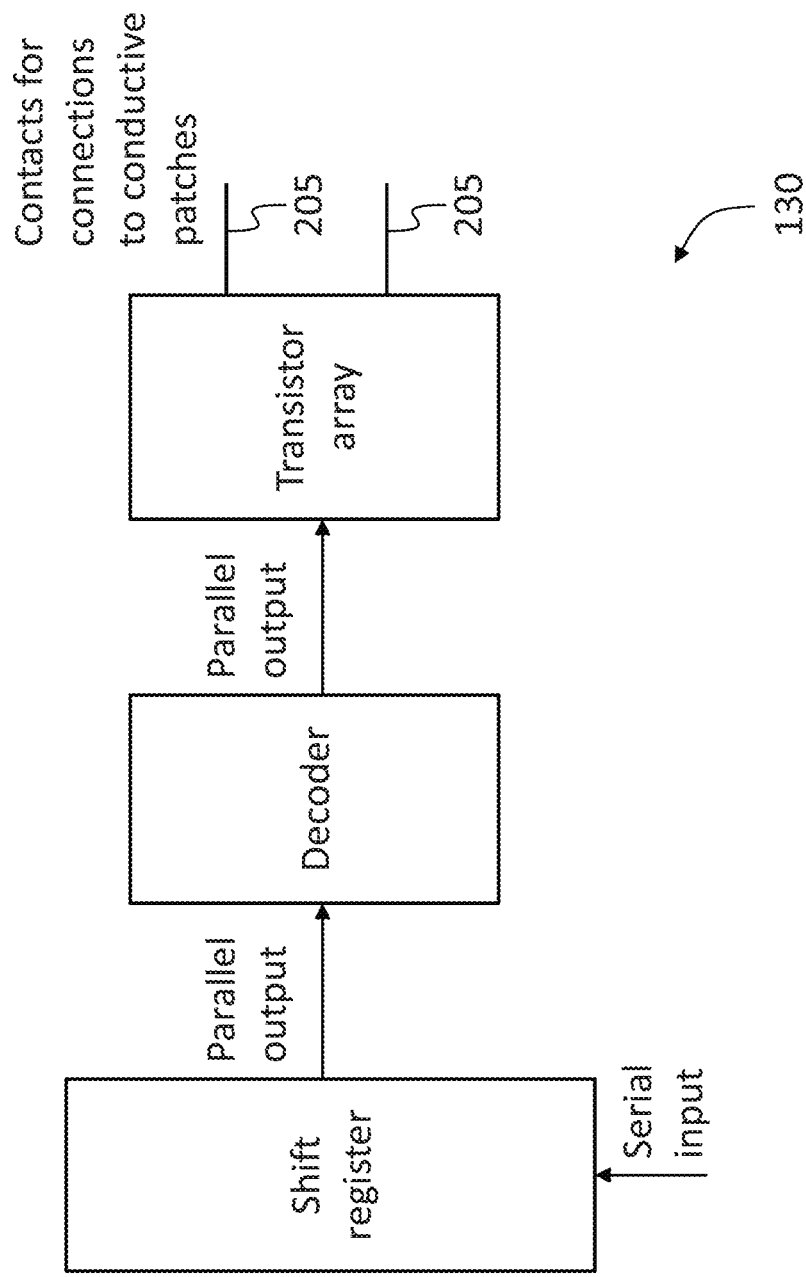
FIG. 3 is a block diagram of an integrated circuit, according to an embodiment of the present invention.

Referring to FIG. 3, each integrated circuit may have a control input, or "data input", e.g., a serial input for receiving a control word, that may be, for example, a 5-bit word. This 5-bit word may select one of up to 32 modes or "states" in which the integrated circuit may be configured, and may be referred to as a mode code. The integrated circuit may include a shift register that stores the control word after it is received at the control input and shifted into the shift register. The outputs of the flip-flops of the shift register may then control the output transistors directly, or, in another embodiment, the control word may be fed to a decoder that may map the control word value to a corresponding set of transistor control bits, each transistor control bit controlling whether a respective transistor is turned on or off. The output transistors may be arranged in a transistor array, which may also include resistive and/or reactive elements, such as those illustrated in FIGS. 2A-2C. In one embodiment, the transistor array includes a plurality of the circuits of FIG. 2A and/or FIG. 2B. and/or FIG. 2C, and some of these circuits have component values for the resistive or reactive elements that differ from the values of corresponding components in other such circuits within the transistor array. The decoder may be implemented as logic, i.e., as a set of logic gates (e.g., hard-wired logic gates) or as a lookup table in (read-write or read-only) memory. In one embodiment the decoder receives a 5-bit control word and outputs 10 control bits for 10 respective transistors. The integrated circuit may be configured to store a first set of bits received at the control input after power up (e.g., 32 10-bit words in the case of a decoder with a 5-bit input and a 10-bit output) in the memory, so that the lookup table may be reprogrammed each time the integrated circuits are powered up. The control inputs of the integrated circuits may be configured to all receive the same broadcast control word simultaneously (e.g., as a result of being connected in parallel).

In one embodiment the integrated circuit has a total chip area of between 0.01 and 0.25 square mm, and a gate density for 130 nm technology or for 180 nm technology of 173610 or 88576 gates per square mm, respectively. In one embodiment an integrated circuit with an area of 0.25 square mm has approximately 60,000 gates. In some embodiments the integrated circuit is square, e.g., it is a square 0.1 mm to 0.5 mm on a side.

Examples of the numbers of gates that may be available in some embodiments are shown in Tables 1A-2B. Tables 1A and 1B show various characteristics expected for integrated circuits fabricated with 130 nm technology or with 180 nm technology, respectively. Tables 2A and 2B show the number of gates that may be fabricated on a chip, in 130 nm technology or 180 mn technology, for two cases, which assume that either bump bonding or wire bonding is used, respectively.

TABLE 1A

| Technology | Typical Voltage | Gates | Cells | Area(squm) | gates/squm | Rdson for 10 um FET |
|---|---|---|---|---|---|---|
| GF/IBM 130 nm | 1.2-1.5 V | 110762 | 29027 | 637993 | 0.174 | 50 |
| GF/IBM 180 nm | 1.5-1.8 V | 45319 | 14897 | 511641 | 0.089 | |

TABLE 1B

| Wirebond pads (um × um) | Wirebond pitch (um) | Bumped pads (um × um) | Bumped pitch (um) | raw gates per 1 sqmm | raw gates per 0.2 sqmm |
|---|---|---|---|---|---|
| 62 × 95 | 73 | 74 × 74 | 200 | 173610 | 34722 |
| 62 × 95 | 73 | 74 × 74 | 200 | 88576 | 17715 |

TABLE 2A

| Chip size | actual chip area after scribing die (um × um) | area in sq mils (mils × mils) | Wafer size (mm dia.) | total die on 200 mm wafer | scribe street (um per side) | Usable die area without pads |
|---|---|---|---|---|---|---|
| 0.2 squm chip | 447 × 447 | 17.6 × 17.6 | 200 | 138928 | 75 | 297 × 297 |

TABLE 2B

| Wirebond pad. Active area less 4 pads on 2 sides (um × um) | Active area wirebond pads already taken out (squm) | Wirebond pad Gates in 130 nm CMOS | Wirebpond pad Gates in 180 nm CMOS |
|---|---|---|---|
| 280 × 90 | 25200 | 4375 | 2232 |

| Active area 4 bumps pad included (um × um) | Active area less bump pads (squm) | Bumped pad Gates in 130 nm CMOS | Bumped pad Gates in 180 nm CMOS |
|---|---|---|---|
| 280 × 280 | 46000 | 7986 | 4074 |

In some embodiments the integrated circuits may be programmed differently across the frequency selective surface. For example, a radome that reflects radiation at a certain frequency over a first portion of its surface and is transparent over a window on a second part of its surface may be fabricated by programming the lookup tables in the integrated circuits on the first and second parts differently, so that when a particular control word is sent to all of the integrated circuits, the transistors in the integrated circuits in the first part of the frequency selective surface switch to a state making the first part of the frequency selective surface reflective at the frequency of interest, and the transistors in the integrated circuits in the second part of the frequency selective surface switch to a state making the second part of the frequency selective surface transparent (i.e., transmissive) at the frequency of interest.

Two conductors may provide power to each integrated circuit and two conductors may provide a control signal. Some of the conductors may be shared, so that for example each integrated circuit may have a common ground connection, a power connection, and a control connection, or "data connection". In some embodiments a single conductive region extending across the entire frequency selective surface, such as the conductive region 140 of FIG. 1B, may act as one conductor, e.g. ground. In some embodiments one conductor may provide both power and data, e.g., the conductor may carry a DC voltage to provide power to the integrated circuit, and, superimposed on the DC voltage, a time-varying voltage carrying data. The integrated circuit may then separate the two components.

Figure 4A:
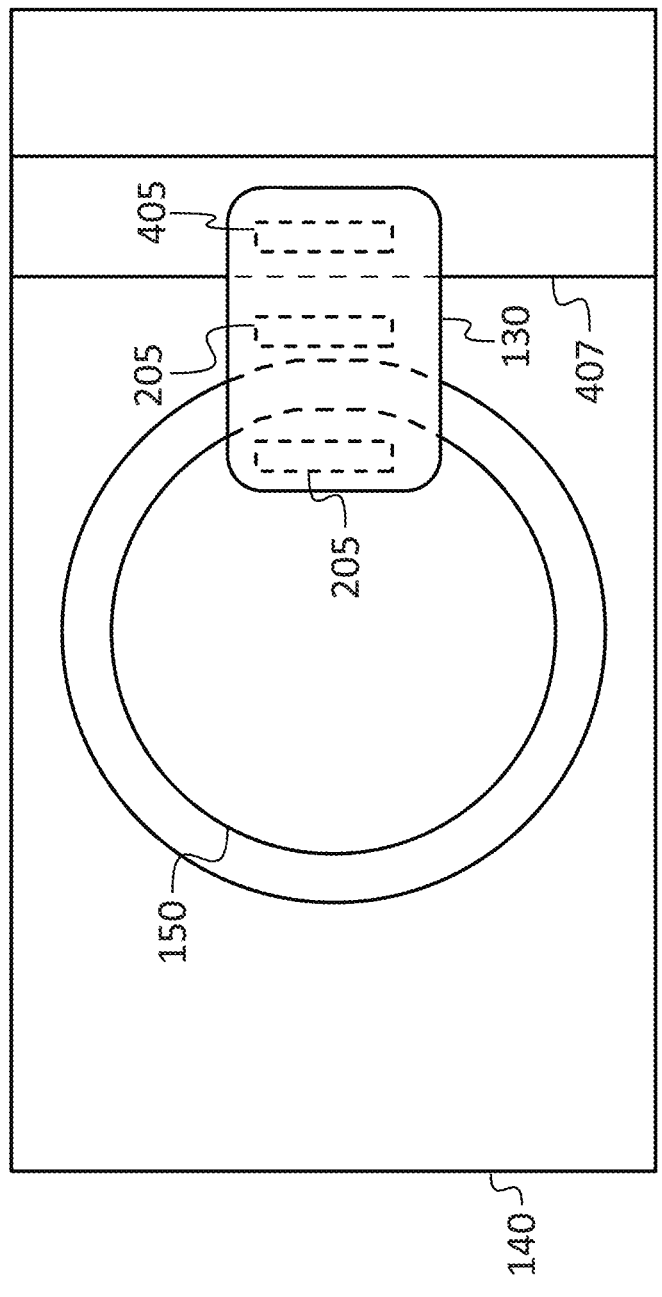
FIG. 4A is an enlarged plan view of a portion of a frequency selective surface, according to an embodiment of the present invention.

Referring to FIG. 4A, each integrated circuit may straddle a gap between two conductive patches. For example, as shown in FIG. 4A, the integrated circuit 130 may straddle the annular gap separating the circular conductive patch 150 from the conductive region 140. The integrated circuit 130 may have two bond pads corresponding to the two contacts 205 at which the integrated circuit is connected to the two conductive patches. The integrated circuit may have a third bond pad 405 at which it connects to a conductive trace 407 providing power or a control signal, or both, to the integrated circuit. The integrated circuit may have additional bond pads for connecting to additional conductors (e.g., conductive traces supplying power or data to the integrated circuit).

In some embodiments, integrated circuits may be installed on a frequency selective surface after it is patterned with conductive patches in the following manner, using a process that may be referred to as substrate transfer. After an integrated circuit wafer (e.g., a silicon wafer having circuitry on its surface) has been fabricated, it may be flipped it over so that it is positioned with the active circuitry down, on a plastic sheet with a coating of adhesive, so that the active side of the wafer is bonded to the plastic sheet. The assembly is then processed with a chemical process that etches the substrate away, leaving only the active circuitry on the plastic film. The wafer may have been pre-sawed before placing it on the plastic sheet, so that the etching process also separates the integrated circuits from each other.

A reel to reel process may then be utilized to unroll the film over the frequency selective surface and an automated tool may push through the plastic film at the location of each integrated circuit, depositing the integrated circuit on the frequency selective surface. Such a process may be well suited for use with a curved surface (e.g., a radome surface), both because the plastic film may be able to deform to conform to the curved surface, and because the integrated circuits may be sufficiently thin to bend slightly to conform to the curved frequency selective surface. In other embodiments a pick and place process may be used to install the integrated circuits on the patterned frequency selective surface.

The frequency selective surface may be fabricated by forming conductive patches on a dielectric substrate. In some embodiments the dielectric substrate of the frequency selective surface may be aluminum oxynitride (which may be referred to as ALON), zinc sulfide, sapphire (aluminum oxide), or a ceramic material. A layer of dielectric may then be formed over the conductive patches, with openings in the dielectric layer through which the integrated circuits may make contact with the conductive patches. The dielectric layer may be, for example, silicon oxide or a polymer such as polyimide or polyurethane. One or more additional conductive layers (e.g., metal layers) may then be deposited on the dielectric layer, to form, for example, power traces to supply power to the integrated circuits or data traces to control the integrated circuits.

Figure 4B:
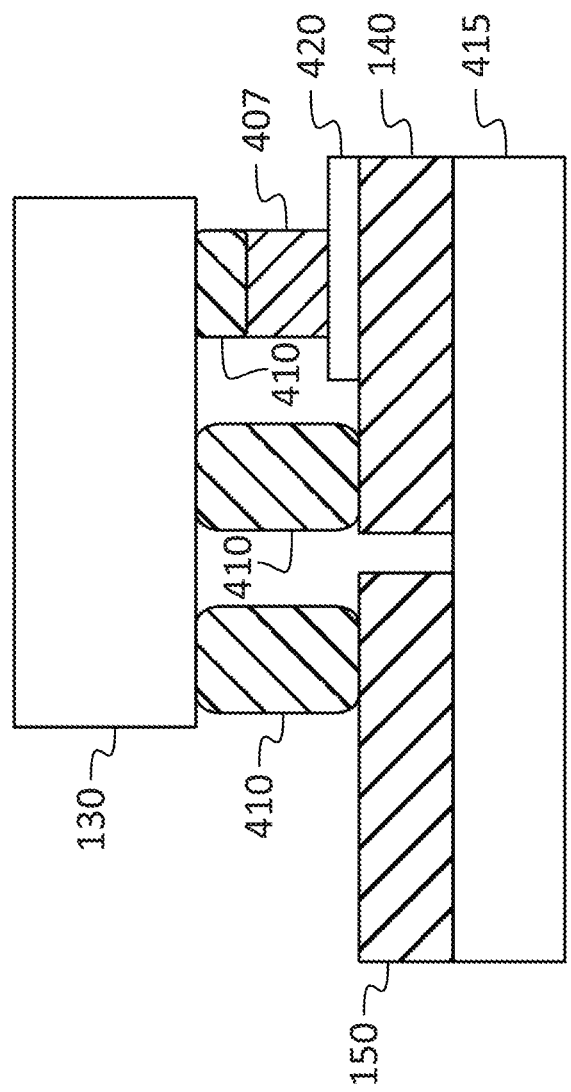
FIG. 4B is an enlarged cross-sectional view of a portion of a frequency selective surface, according to an embodiment of the present invention.

In one embodiment the integrated circuits are connected to the conductive patches or traces using a method that may be referred to as bump bonding. Each bond pad on each integrated circuit may have a rounded metal cap, or "bump" on it, and when the integrated circuit is placed on the patterned frequency selective surface, the bump may deform slightly as the integrated circuit is pressed onto the patterned frequency selective surface. The force applied to press the integrated circuit onto the patterned frequency selective surface may enable the formation of a good conductive contact between each bond pad of the integrated circuit and the corresponding conductive surface of the frequency selective surface, and the deformation of each bump may allow the placement process to accommodate some differences in height (i.e., "terracing") of the conductive planes on the frequency selective surface. Referring to 4B, one embodiment includes a substrate 415, a first conductive patch 140, a second conductive patch 150, a dielectric layer 420, and a conductive trace 407. In this embodiment, the height of the top surface of the conductive trace 407 is greater than the height of the two other contact areas, and the corresponding bumps 410 have correspondingly different residual thicknesses after the integrated circuit is installed. FIG. 4B is not drawn to scale and in some embodiments the height difference is about 1 micron.

Figure 1B:
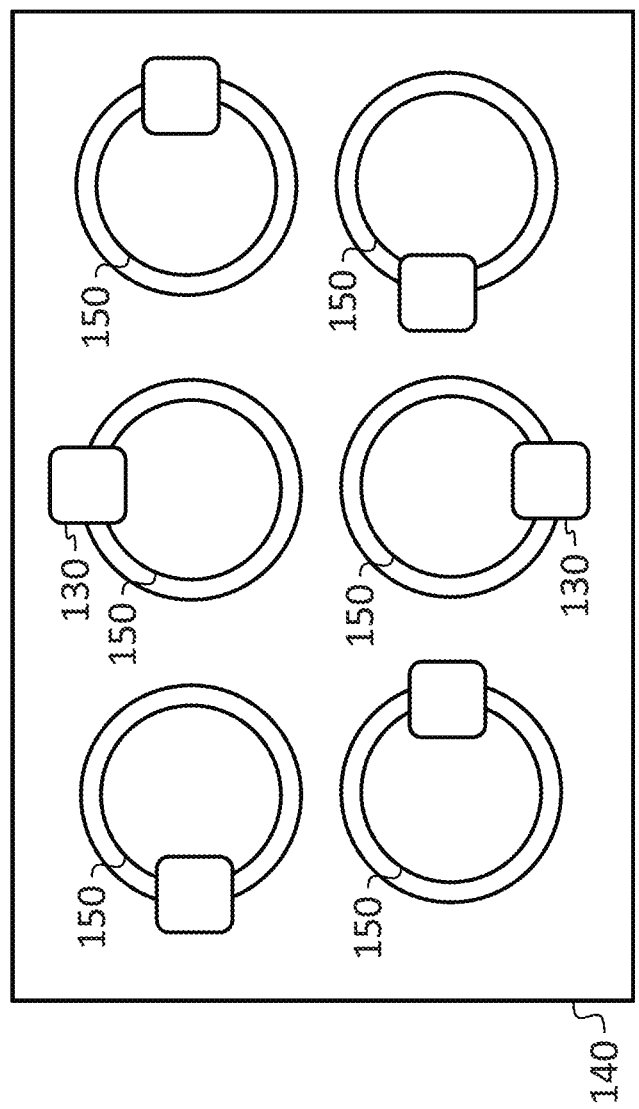
FIG. 1B is a plan view of a frequency selective surface, according to another embodiment of the present invention.

Power and data traces may be routed entirely behind a single conductive region extending across the entire frequency selective surface, such as the conductive region 140 of FIG. 1B, if the frequency selective surface has such a region. In this manner the effect of the power and data traces on the reflection and transmission characteristics of the frequency selective surface may be slight. If the frequency selective surface lacks such a region (e.g., the frequency selective surface of FIG. 1A), then the effects of power and data traces may be analyzed with a suitable numerical modeling tool and adjustments to the conductive patches (or to the controllable impedance elements) may be made to compensate for the presence of the power and data traces, so that the behavior of the system is acceptable in the presence of the power and data traces. In some embodiments the power and data traces are capacitively coupled to ground at a boundary of the frequency selective surface so that changes in cabling connected to these traces (to connect the frequency selective surface to a power supply and control system) or changes in circuits connected to the frequency selective surface, may have little effect on the reflection and transmission characteristics of the frequency selective surface. In some embodiments the dimensions of the power and data traces may be such that they do not significantly affect the reflection and transmission characteristics of the frequency selective surface (e.g., they may be too long to be resonant at any frequency of interest).

Figure 5A:
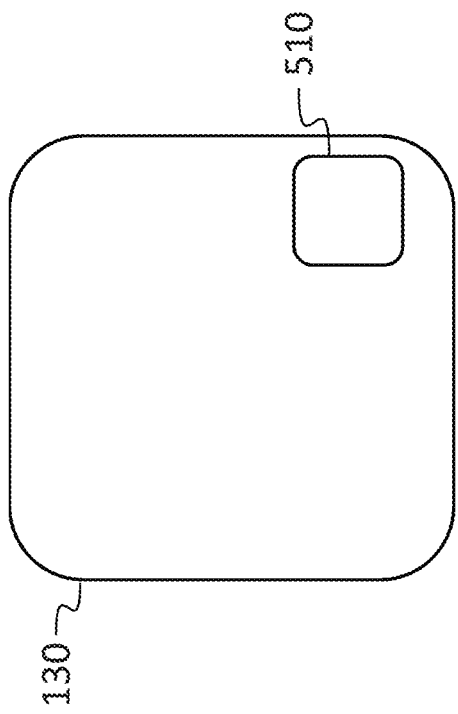
FIG. 5A is a plan view of an integrated circuit including a solar cell, according to an embodiment of the present invention.
Figure 5B:
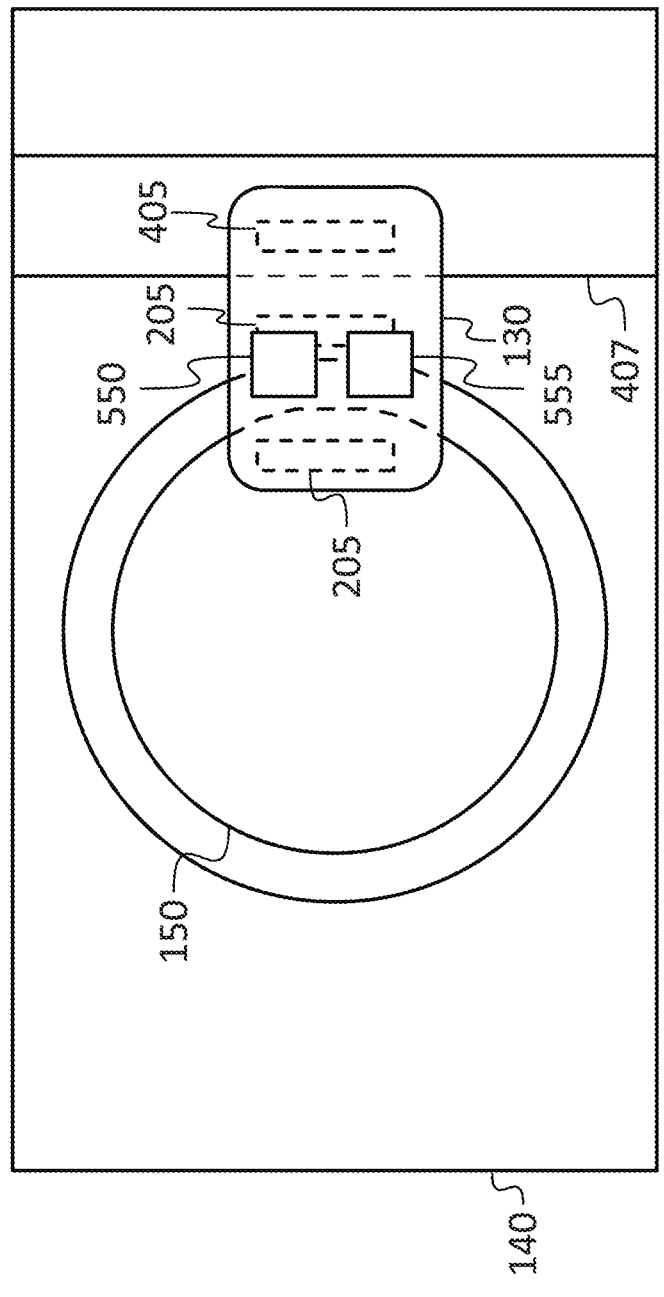
FIG. 5B is an enlarged plan view of a portion of a frequency selective surface, according to an embodiment of the present invention.

Referring to FIGS. 5A and 5B, in some embodiments, each integrated circuit 130 includes a photovoltaic cell, or "solar" cell 510. In some embodiments, each integrated circuit may include two solar cells 550, 555. A first solar cell absorbs light to generate operating power for the integrated circuit, and a second solar cell acts as an optical receiver that receives a control signal modulated onto an optical beam (e.g., onto a laser beam). The two solar cells may respond to different wavelength ranges of light, so that, for example, light used to provide power to the integrated circuits need not interfere with the light used to control the integrated circuits. Each integrated circuit may then have only two electrical contacts, connected to corresponding conductive patches on the frequency selective surface and forming the output of the integrated circuit. In some embodiments each integrated circuit 130 includes three solar cells (e.g., for power, a control signal, and a clock signal, as described above).

In such an embodiment, the integrated circuits may be powered and controlled independently of each other, so that for example the integrated circuits may be unpowered in a first, unilluminated portion of the frequency selective surface and powered and controlled in a second portion of the frequency selective surface that is illuminated to provide power to the integrated circuits and that is, or has been, illuminated with modulated light to set all of the integrated circuits to a desired control state. In another embodiment the entire frequency selective surface is illuminated with light (e.g., infrared or visible light of a first wavelength) to which the first solar cells are sensitive, so that all of the integrated circuits receive power, and different portions of the frequency selective surface are illuminated by corresponding beams to which the second solar cells are sensitive (e.g., beams of infrared or visible light, at a wavelength shorter than the first wavelength, from a plurality of modulated lasers) to provide different control data to different portions of the frequency selective surface. In some embodiments one or more light emitting diodes (LEDs) are used to provide power and/or control signals to the integrated circuits. In some embodiments a clock signal for clocking the control signal is separately distributed optically (e.g., as a modulation signal applied to light of third wavelength, detected by a third solar cell at each integrated circuit). In some embodiments one or more of the wavelengths may correspond to ultraviolet light.

The integrated circuits may be sufficiently transparent that illumination from either the top or the bottom may be effective to provide power and control signals to the integrated circuits. In one embodiment a radome includes a relatively thick dielectric shell, with conductive patches formed on its inner surface, and with integrated circuits bonded to the conductive patches, e.g., using a substrate transfer method. The integrated circuits may be illuminated (i.e., back-side illuminated) by one or more light sources inside the radome. In some embodiments each integrated circuit has only one solar cell and modulated light at one wavelength or in one wavelength band is used to provide both power and control, with the DC component of the light providing power, and the integrated circuit detecting the modulation on the light and the control signal that the modulation encodes.

In some embodiments using light to power and control the integrated circuits makes it possible to reduce the number of pads on each integrated circuit, freeing up chip area that would otherwise be occupied by pads for circuitry (e.g., gates). For example, the area that otherwise may be consumed by a 75 micron by 75 micron pad may be used instead to fabricate over 500 gates. In some embodiments the solar cells (e.g., silicon germanium solar cells) are sensitive to light that does not affect the operation of (e.g., is not absorbed by) the circuitry of the integrated circuit (e.g., light having a wavelength (e.g., 1.55 microns) that is too long to affect the operation of the circuitry of the integrated circuits (which may be complementary metal-oxide semiconductor (CMOS) integrated circuits fabricated on silicon)) directly. In one embodiment a frequency selective surface is capable of being reconfigured in less than a second, e.g., in as little as 1 millisecond. For example, at time tick #1, the switches (e.g., transistors) in the integrated circuit may be configured so that the frequency selective surface appears to a threat like a solid sheet of metal, at time tick #2, the switches in the integrated circuit may be configured so that the frequency selective surface appears like an RF window at radar frequency of a vessel or aircraft carrying the frequency selective surface, and at time tick #3, the switches in the integrated circuit may be configured so that the frequency selective surface appears like a radio frequency (RF) absorber of threat energy. In some embodiments the transmission and/or the reflection characteristics of the frequency selective surface may change by at least a factor of 10, or by at least a factor of 100 at an electromagnetic wavelength between 1 mm and 10 m, when one or more of the integrated circuits are reconfigured by sending each a new control word.

In some embodiments, integrated circuits each containing thousands of CMOS gates may be placed with the pitch of a 2-20 GHz frequency selective surface. Placing multiple circuits at different locations on the frequency selective surface unit cell provides a way to alter the real (resistance) and imaginary (reactance) components of the impedance of the frequency selective surface unit cell. The integrated circuits have decoders that allow the entire array of integrated circuits to be programmed either from electric bussing or optical addressing. Optical addressing is particularly novel since no extra bus wiring is required. A laser is used to illuminate the entire frequency selective surface radome to broadcast configuration data.

Although limited embodiments of a programmable frequency selective surface have been specifically described and illustrated herein, many modifications and variations will be apparent to those skilled in the art. Accordingly, it is to be understood that a programmable frequency selective surface employed according to principles of this invention may be embodied other than as specifically described herein. The invention is also defined in the following claims, and equivalents thereof.

What is claimed is:

1. A controllable frequency-selective surface, comprising:
a dielectric substrate;
a plurality of conductive patches on a first surface of the dielectric substrate; and
a plurality of integrated circuits, each
straddling a gap between a first patch of the plurality of conductive patches and a second patch of the plurality of conductive patches,
connected at a first contact to the first patch and at a second contact to the second patch, and
being configured to receive a digital control word and to change, in response, an impedance between the first contact and the second contact, to cause an electromagnetic transmission or reflection characteristics of the frequency-selective surface to change.

2. The controllable frequency-selective surface of claim 1, wherein each of the plurality of integrated circuits is configured to receive the digital control word through a conductive electrical data connection.

3. The controllable frequency-selective surface of claim 2, further comprising:
a dielectric layer on the plurality of conductive patches; and
a conductive trace on the dielectric layer,
wherein the data connection comprises the conductive trace.

4. The controllable frequency-selective surface of claim 2, wherein an integrated circuit of the plurality of integrated circuits straddles a first gap and comprises an array of switches configured to operate in a first state and in a second state, wherein a conductance across the first gap through the integrated circuit in the first state is different from the conductance across the first gap through the integrated circuit in the second state.

5. The controllable frequency-selective surface of claim 2, wherein an integrated circuit of the plurality of integrated circuits straddles a first gap and comprises an array of switches configured to operate in a first state and in a second state, wherein a real part of a conductance across the first gap through the integrated circuit in the first state is different from the real part of the conductance across the first gap through the integrated circuit in the second state.

6. The controllable frequency-selective surface of claim 2, wherein an integrated circuit of the plurality of integrated circuits straddles a first gap and comprises an array of switches configured to operate in a first state and in a second state, wherein an imaginary part of a conductance across the first gap through the integrated circuit in the first state is different from the imaginary part of the conductance across the first gap through the integrated circuit in the second state.

7. The controllable frequency-selective surface of claim 2, wherein the integrated circuits of the plurality of integrated circuits are configured to receive the control word simultaneously.

8. The controllable frequency-selective surface of claim 7, wherein:
an integrated circuit of the plurality of integrated circuits comprises an array of switches,
a conductance across the gap through the integrated circuit is determined by respective states of the switches of the array of switches, and
the integrated circuit is configured to set the states of the switches of the array of switches based on a received code word.

9. The controllable frequency-selective surface of claim 2, wherein an integrated circuit of the plurality of integrated circuits comprises:
a shift register having:
a serial input connected to a control input of the integrated circuit and
a parallel output;
a decoder having:
an input connected to the parallel output of the shift register and
a parallel output comprising a plurality of switch control lines; and
an array of switches, each of the array of switches being connected to a respective switch control line of the plurality of switch control lines.

10. The controllable frequency-selective surface of claim 2, wherein each switch is a transistor.

11. The controllable frequency-selective surface of claim 1, wherein each of the plurality of integrated circuits is configured to receive the digital control word through an optical data connection.

12. The controllable frequency-selective surface of claim 11, wherein an integrated circuit of the plurality of integrated circuits straddles a first gap and comprises an array of switches configured to operate in a first state and in a second state, wherein a conductance across the first gap through the integrated circuit in the first state is different from the conductance across the first gap through the integrated circuit in the second state.

13. The controllable frequency-selective surface of claim 11, wherein an integrated circuit of the plurality of integrated circuits straddles a first gap and comprises an array of switches configured to operate in a first state and in a second state, wherein a real part of a conductance across the first gap through the integrated circuit in the first state is different from the real part of the conductance across the first gap through the integrated circuit in the second state.

14. The controllable frequency-selective surface of claim 11, wherein an integrated circuit of the plurality of integrated circuits straddles a first gap and comprises an array of switches configured to operate in a first state and in a second state, wherein an imaginary part of a conductance across the first gap through the integrated circuit in the first state is different from the imaginary part of the conductance across the first gap through the integrated circuit in the second state.

15. The controllable frequency-selective surface of claim 11, wherein the integrated circuits of the plurality of integrated circuits are configured to receive the control word simultaneously.

16. The controllable frequency-selective surface of claim 15, wherein:
   an integrated circuit of the plurality of integrated circuits comprises an array of switches,
   a conductance across the gap through the integrated circuit is determined by respective states of the switches of the array of switches, and
   the integrated circuit is configured to set the states of the switches of the array of switches based on a received code word.

17. The controllable frequency-selective surface of claim 11, wherein an integrated circuit of the plurality of integrated circuits comprises:
   a shift register having:
      a serial input connected to a control input of the integrated circuit and
      a parallel output;
   a decoder having:
      an input connected to the parallel output of the shift register and
      a parallel output comprising a plurality of switch control lines; and
   an array of switches, each of the array of switches being connected to a respective switch control line of the plurality of switch control lines.

18. The controllable frequency-selective surface of claim 11, wherein each switch is a transistor.

19. The controllable frequency-selective surface of claim 11, wherein the integrated circuit is configured to receive operating power in the form of illumination by light.

20. The controllable frequency-selective surface of claim 11, wherein the optical data connection comprises a first solar cell, and
   wherein the integrated circuit is configured to receive:
      operating power through a second solar cell; and
      a clock signal through a third solar cell,
   the first solar cell being sensitive to light at a first wavelength, insensitive to light at a second wavelength, and insensitive to light at a third wavelength;
   the first wavelength being different from the second wavelength and from the third wavelength, and the second wavelength being different from the third wavelength,
   the second solar cell being sensitive to light at the second wavelength, insensitive to light at the first wavelength, and insensitive to light at the third wavelength;
   the third solar cell being sensitive to light at the third wavelength, insensitive to light at the first wavelength, and insensitive to light at the second wavelength;
   the integrated circuit being insensitive, except for the first solar cell, the second solar cell, and the third solar cell, to light at each of the first wavelength, the second wavelength, and the third wavelength.

* * * * *